(12) United States Patent
Khanna et al.

(10) Patent No.: US 11,847,430 B2
(45) Date of Patent: *Dec. 19, 2023

(54) NON-VOLATILE COUNTER SYSTEM, COUNTER CIRCUIT AND POWER MANAGEMENT CIRCUIT WITH ISOLATED DYNAMIC BOOSTED SUPPLY

(71) Applicant: Texas Instruments Incorporated, Dallas, TX (US)

(72) Inventors: Sudhanshu Khanna, Plano, TX (US); Hao Meng, Shanghai (CN); Michael Zwerg, Dallas, TX (US); Christy Leigh She, Allen, TX (US); Steven Craig Bartling, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/521,019

(22) Filed: Nov. 8, 2021

(65) Prior Publication Data

US 2022/0057996 A1 Feb. 24, 2022

Related U.S. Application Data

(63) Continuation of application No. 16/711,042, filed on Dec. 11, 2019, now Pat. No. 11,200,030, which is a (Continued)

(30) Foreign Application Priority Data

Jul. 27, 2017 (WO) ................ PCT/CN2017/094687

(51) Int. Cl.
*H03K 5/00* (2006.01)
*G06F 7/62* (2006.01)
(Continued)

(52) U.S. Cl.
CPC .................. *G06F 7/62* (2013.01); *G06F 1/26* (2013.01); *G06F 1/30* (2013.01); *G08C 13/02* (2013.01);
(Continued)

(58) Field of Classification Search
CPC ......... H03K 5/24; H03K 21/40; H03K 21/403
See application file for complete search history.

(56) References Cited

U.S. PATENT DOCUMENTS 5,565,769 A 10/1996 Mehnert et al.
6,081,154 A 6/2000 Ezell et al.
(Continued)

FOREIGN PATENT DOCUMENTS

CN 2015669753 U 9/2010
CN 203444515 U 2/2014

OTHER PUBLICATIONS

"Memory Data-Processing FRAM 16 K (2 K x 8) Bit Dual SPI," MB85RDP16LX, Fujitsu Semiconductor Data Sheet, DS501-00031-1v0-E, Oct. 2014, 32 pages.
(Continued)

*Primary Examiner* — Tuan T Lam
(74) *Attorney, Agent, or Firm* — Brian D. Graham; Frank D. Cimino

(57) ABSTRACT

Disclosed examples include non-volatile counter systems to generate and store a counter value according to a sensor pulse signal, and power circuits to generate first and second supply voltage signals to power first and second power domain circuits using power from the sensor pulse signal, including a switch connected between first and second power domain supply nodes, a boost circuit, and a control circuit to selectively cause the switch to disconnect the first and second power domain circuits from one another after the first supply voltage signal rises above a threshold voltage in
(Continued)

a given pulse of the sensor pulse signal, and to cause the boost circuit to boost the second supply voltage signal after the regulator output is disconnected from the second power domain supply node in the given pulse.

18 Claims, 2 Drawing Sheets

Related U.S. Application Data continuation of application No. 15/828,204, filed on Nov. 30, 2017, now Pat. No. 10,545,728.

(51) Int. Cl.
*G06F 1/30* (2006.01)
*G06F 1/26* (2006.01)
*G08C 13/02* (2006.01)
*H03K 5/24* (2006.01)
*H03K 21/40* (2006.01)
*G11C 11/56* (2006.01)

(52) U.S. Cl.
CPC ........... *H03K 5/24* (2013.01); *G11C 11/56* (2013.01); *H03K 21/40* (2013.01); *H03K 21/403* (2013.01)

(56) References Cited

U.S. PATENT DOCUMENTS

| | | | |
|---|---|---|---|
| 6,573,726 B1 | 6/2003 | Roberts et al. | |
| 6,628,741 B2 | 9/2003 | Netzer | |
| 7,343,966 B2* | 3/2008 | Nitta ...................... | F28F 9/182 |
| | | | 165/174 |
| 8,964,445 B1 | 2/2015 | Shen et al. | |
| 9,058,126 B2 | 6/2015 | Bartling et al. | |
| 9,343,966 B1* | 5/2016 | Thakur ................ | H02M 3/156 |
| 10,187,061 B1* | 1/2019 | Venugopal ......... | H03K 19/0013 |
| 10,310,579 B2* | 6/2019 | Kawasoe .............. | G11C 5/147 |
| 2006/0140331 A1 | 6/2006 | Du et al. | |
| 2008/0067995 A1* | 3/2008 | Chua-Eoan ........... | H02M 3/158 |
| | | | 323/284 |
| 2011/0221416 A1 | 9/2011 | Ivanov et al. | |
| 2013/0131771 A1* | 5/2013 | Lehmann ........... | A61N 1/36125 |
| | | | 607/116 |
| 2013/0207695 A1 | 8/2013 | Jeon et al. | |
| 2014/0075090 A1 | 3/2014 | Bartling et al. | |
| 2014/0075091 A1 | 3/2014 | Bartling et al. | |
| 2014/0075218 A1 | 3/2014 | Bartling et al. | |
| 2014/0075225 A1 | 3/2014 | Bartling et al. | |
| 2014/0075233 A1 | 3/2014 | Bartling et al. | |
| 2014/0103728 A1 | 4/2014 | Shrivastava et al. | |
| 2014/0210535 A1 | 7/2014 | Bartling et al. | |
| 2014/0375284 A1 | 12/2014 | Guo et al. | |
| 2015/0194886 A1* | 7/2015 | Zanetta .................. | G05F 1/573 |
| | | | 327/309 |
| 2015/0211470 A1* | 7/2015 | Pereira ................ | F02N 11/0862 |
| | | | 701/113 |
| 2015/0355662 A1* | 12/2015 | Myers ...................... | G06F 1/26 |
| | | | 323/311 |
| 2016/0246355 A1 | 8/2016 | Dannenberg et al. | |
| 2016/0308372 A1* | 10/2016 | Kolla .................... | G06F 1/3296 |
| 2017/0331463 A1* | 11/2017 | Wang ...................... | G06F 1/26 |
| 2018/0175832 A1* | 6/2018 | Sutanthavibul .... | H03K 19/0016 |

OTHER PUBLICATIONS

"Weigand Effect," Beijing Tianlong Control System Ltd., https://www.tcs-access.com/sensor/english/weigandeffect.htm, Apr. 28, 2017, 3 pages.

* cited by examiner

NON-VOLATILE COUNTER SYSTEM, COUNTER CIRCUIT AND POWER MANAGEMENT CIRCUIT WITH ISOLATED DYNAMIC BOOSTED SUPPLY

CROSS-REFERENCE TO RELATED APPLICATIONS

This application is a continuation application of U.S. patent application Ser. No. 16/711,042 filed Dec. 11, 2019, which is a continuation application of U.S. patent application Ser. No. 15/828,204 filed on Nov. 30, 2017, titled "Non-Volatile Counter System, Counter Circuit and Power Management Circuit with Isolated Dynamic Boosted Supply," now U.S. Pat. No. 10,545,728, which is a continuation application of International Application No. PCT/CN2017/094687, filed on Jul. 27, 2017, which applications are hereby incorporated herein by reference in their entireties.

BACKGROUND

Non-volatile counters are used in a variety of position detection applications for counting pulses from a sensor. For example, flowmeters can include rotating components with magnetic elements and sensors to detect a rotating magnet passing a fixed point. A counter provides a counter value representing the number of detected magnetic pulses, and hence, the amount of liquid flow through the meter. Other position sensor applications include elevator pulley systems with rotating components that provide changing magnetic fields that can be sensed by magnetic sensors. Some counter systems count pulses from two or more sensors and selectively determine whether the counter value should be incremented or decremented based on the sensor pulse signals. Non-volatile pulse counter systems are useful in a variety of situations in which power is lost but the position of a rotating or moving structure is needed. For example, utility meters are used to assess the amount of water used by customers for billing purposes. Electrically powered flowmeters can be used to provide a counter value representing the amount of water used by a particular customer. It is desirable to update the counter value to account for water usage even when external power is unavailable. In another example, automated rotating tools or machinery can be manually rotated while power is removed. Non-volatile pulse counter systems use energy harvested from the rotation of the system components in order to operate the counter for incrementing or decrementing as appropriate. This allows the system, upon power up, to know the position of the movable parts and operate accordingly. In another example, elevator transport systems can undergo power loss while in motion, and the momentum of the elevator causes a position change even after power is removed. Non-volatile counter systems allow a counter value to be updated even while external power is unavailable in order to correctly indicate the position of the elevator when power is restored. For certain applications such as flow meters and rotary encoders, the position sensors need to be compact, and the use of small, low cost energy harvesting sources is beneficial. However, the energy available for harvesting to power a non-volatile counter is restricted when system power is unavailable.

SUMMARY

Disclosed examples include non-volatile counter systems to generate and store a counter value according to a sensor pulse signal, and power circuits to generate first and second supply voltage signals to power logic and memory circuits using power from the sensor pulse signal. The power circuit in one aspect includes a switch connected between first and second power domain supply nodes, a boost circuit, and a control circuit. The control circuit causes the switch to disconnect the first and second power domain circuits from one another before the second supply generation signal is activated. In addition, the control circuit causes the boost circuit to boost the second supply voltage signal after the regulator output is disconnected from the second power domain supply node in the given pulse.

DETAILED DESCRIPTION

Figure 1:
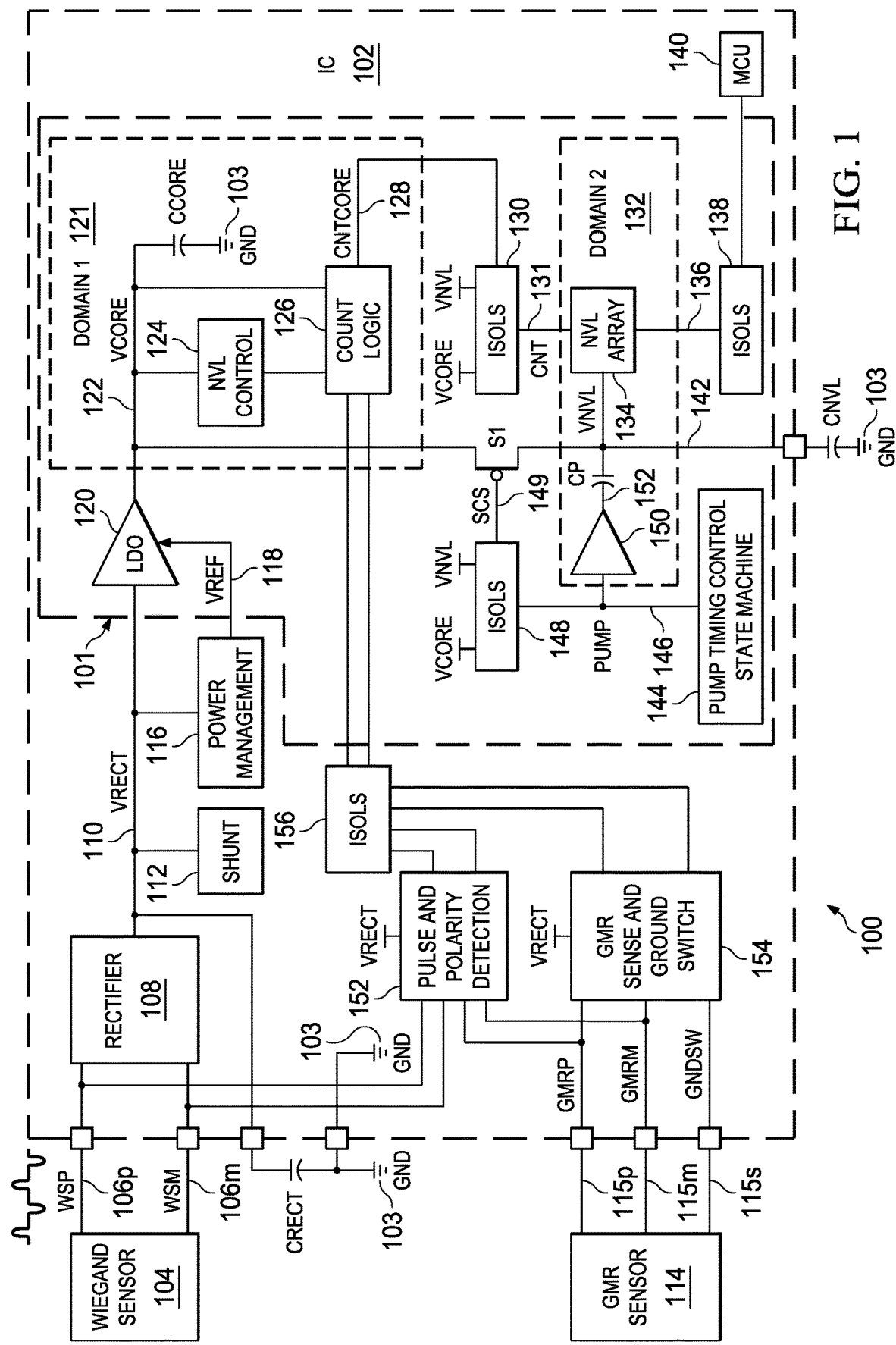
FIG. 1 is a schematic diagram of a non-volatile counter system with a power circuit to provide supply voltages to first and second power domains using power from a sensor pulse signal.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIG. 1 shows a non-volatile counter system 100 that generates and stores a counter value. The system 100 includes a power circuit 101 with multiple power domains. The power circuit 101 in one example is fabricated in an integrated circuit 102 that implements a non-volatile counter circuit. In certain implementations, the IC 102 forms part of a system-on-chip (SOC) product that includes one or more additional computational blocks (not shown). The counter system 100 can be used as part of a position sensing solution for a variety of applications, including without limitation flow sensors and rotary and/or linear position sensors. The IC 102 includes terminals to interface with one or more sensors. In the example of FIG. 1, a Wiegand sensor 104 includes a first output 106p (e.g., positive or plus) that provides a sensor signal WSP, and a second (e.g., negative or minus) output 106m that provides a sensor signal WSM to the counter circuit IC 102. The signals WSP and WSM together form a differential sensor pulse signal. The Wiegand sensor 104 in one example includes small diameter ferromagnetic wire having magnetic properties such that reversal of a magnetic field proximate the sensor 104 causes the sensor 104 to generate a voltage pulse signal WSP, WSM, which in this case can be referred to as a Wiegand Pulse. In other examples, different types of sensors can be used which provide a single ended or differential sensor pulse signal in response to a changing ambient magnetic field or other sensed condition that represents motion of a host structure (not shown) relative to the sensor.

In operation, the counter IC 102 generates and stores a counter value that can be used by a host system or connected processor (not shown) to determine a position of a host structure relative to the sensor 104. In addition, as detailed further below, the counter IC 102 includes power circuitry to harvest energy from the sensor pulse signal WSP, WSM to allow operation of the counter value update logic and a non-volatile memory. Furthermore, the disclosed examples provide novel power signal generation to intelligently use the energy from a single pulse of the sensor pulse signal WSP, WSM, to read a current counter value from an on-board non-volatile memory, update the counter value according to the sensor pulse signal WSP, WSM, and store the counter value. This provides non-volatile counter operation in the absence of external power supplies.

As seen in FIG. 1, the counter IC 102 includes a supply circuit 108 which generates a supply voltage signal VRECT using power from the sensor pulse signal WSP, WSM. In one example, the supply circuit 108 is a rectifier circuit including two inputs individually connected to the sensor outputs 106*p* and 106*m*. The rectifier 108 in this example also includes first and second diodes (not shown) with anodes individually connected to a corresponding one of the input lines 106*p*, 106*m*, and cathodes connected to a single-ended supply output 110 to generate the supply voltage signal VRECT using power from the sensor pulse signal WSP, WSM. As schematically shown in FIG. 1, the differential sensor pulse signal WSP, WSM can include positive pulses as well as negative pulses, although not a strict requirement of all possible implementations. The rectifier 106 rectifies both positive and negative pulses to provide the rectifier output signal VRECT. An external rectifier capacitor CRECT is connected by corresponding IC terminals between the supply output 110 and a system ground or other constant voltage reference node 103 (e.g., GND). In other possible implementations, the rectifier capacitor CRECT is internal to the IC 102. The rectifier circuit 108 and the rectifier capacitor CRECT operate to provide a DC voltage signal VRECT using energy from the sensor pulse signal WSP, WSM. A shunt circuit 112 protects against overvoltage conditions on the supply output.

The system in one example includes two or more sensors, which can be of the same type, or can be of different types, for example, Wiegand sensors, fluxgate sensors, anisotropic magnetoresistive (AMR) sensors, and/or gigantic magnetoresistive (GMR) sensors. The counter circuit IC 102 in FIG. 1 includes a GMR sensor 114 mounted to sense the ambient magnetic field or other sensed condition that represents motion of the host structure (not shown). The GMR sensor 114 includes plus and minus signal connections 115*p* and 115*m*, respectively, as well as a ground switch connection 115*s* which are connected to the IC 102 by corresponding IC terminals.

The rectifier output signal VRECT powers the power circuit 101 as well as one or more additional loads. The IC 102 includes a power management circuit 116 powered by the rectifier output signal VRECT. The power management circuit 116 includes an output 118 to provide a reference voltage VREF to the power circuit 101. The power circuit 101 includes a regulator circuit 120 with an output 122 that provides the first supply voltage signal VCORE using power from the supply voltage signal VRECT. Any suitable regulator circuit can be used that provides a voltage signal VCORE to the power circuit 101 to implement counter value updating and storage functions. In one example, the regulator circuit 120 is a low dropout (LDO) regulator that regulates the voltage signal VCORE according to the reference voltage VREF from the power management circuit 116. The regulator circuit 120 includes an input coupled with the supply output 110 to receive the VRECT signal from the supply circuit 108, and a regulator output that generates the first supply voltage signal VCORE using power from the supply voltage signal VRECT.

The power circuit 101 includes a first power domain circuit 121 (labeled DOMAIN 1 in FIG. 1) with a first power domain supply node 122 connected to receive the supply voltage signal VCORE from the regulator output. The IC 102 includes a first domain capacitor CCORE connected between the supply output 110 and the circuit ground node 103. The first power domain circuit 121 includes a count logic circuit 126 powered by the first supply voltage signal VCORE, as well as a nonvolatile (NVL) control circuit 124 also powered by the VCORE signal. The logic circuit 126 includes an interface 128 to send and receive first data signals CNTCORE representing a counter value. The interface 128 in one example is a serial interface with one or more signal lines to send and receive the data signals CNTCORE. A parallel interface can be used in other examples. The interface 128 transfers data to and from the logic circuit 126 via an isolation/level shift circuit 130.

The power circuit 101 includes a second power domain 132 including a non-volatile memory circuit or memory array 134 powered by a second supply voltage signal VNVL. The memory circuit 134 includes a second interface 131 to send and receive second data signals CNT representing the counter value. The memory circuit 134 stores the counter value and allows read or write access to the counter value by a processor or MCU 140 or other associated host circuit. In FIG. 1, the MCU 140 interfaces with a second interface 136 of the non-volatile memory 134 by an isolation and level shifting circuit 138. In this example implementation, the MCU 140 is powered by a different power domain than the memory 134. In this configuration, the MCU 140 may lose power, while the memory 134 is provided with power via the second supply voltage signal VNVL at a second power domain supply node 142. The second supply voltage signal VNVL is generated using power harvested from the sensor pulse signal WSP, WSM. Initially, in each given pulse of the sensor pulse signal WSP, WSM, the second supply voltage signal VNVL is generated by the regulator circuit 120. Later in the given pulse, a boost circuit formed by a buffer 150 and a pump capacitor CP boosts the voltage signal VNVL above the level of the first supply voltage signal VCORE. The boost circuit includes a boost output connected to the second power domain supply node 142. The boost circuit selectively boosts or raises the second supply voltage signal VNVL according to a control signal PUMP.

The power circuit 101 also includes a pump timing control state machine or other control circuit 144, as well as a switch S1, and another isolation and level shifting circuit 148. The switch S1 is connected between the first and second power domain supply nodes 122 and 142. Any suitable switch can be used that operates to selectively connect or disconnect the domain supply nodes 122 and 142 according to a switching control signal SCS. In the illustrated example, the switch S1 is a PMOS transistor with a source connected to the node 142, a drain connected to the node 122, and a gate control terminal connected to an output 149 of the level shift circuit 148 to receive the switching control signal SCS. A second domain capacitor CNVL is connected between the second domain supply node 142 and the circuit ground (GND) 103. In the illustrated example, the capacitor CNVL is external to the IC 102, and the IC includes a terminal for connecting the external capacitor. In other examples, the second domain capacitor CNVL can be internal to the counter circuit IC 102.

The control circuit 144 includes a control output 146 that provides the control signal PUMP. The control circuit 144 in one example is powered by the supply voltage signal VCORE of the first power domain 121. When the first power domain circuit 121 is initially unpowered (e.g., between pulses of the sensor pulse signal WSP, WSM), the PUMP signal is low, and the switching control signal SCS at the level shift circuit output 149 is also low. When the rectifier output voltage VRECT rises in response to a given pulse of the sensor pulse signal WSP, WSM, the regulator circuit 120 provides the first supply voltage signal VCORE at a positive voltage, and the switch S1 is turned on by the low switching control signal SCS. This also causes VNVL to rise to the same level as VCORE. The control circuit 144 in one example implements a state machine that asserts the PUMP signal active high a predetermined time after the first supply voltage signal VCORE rises to the level VREF in a given pulse of the sensor pulse signal WSP, WSM (e.g., 218 in FIG. 2 below). This causes the switching control signal SCS to transition high, which turns off the switch S1 and disconnects the regulator output at the first domain supply node 122 from the second power domain supply node 142.

The PUMP signal is also provided as an input to the buffer circuit 150. The buffer circuit 150 can be any suitable circuit, such as CMOS transistors, that provides an output to a terminal of the capacitor CP having a logic state corresponding to the state of the PUMP signal. The buffer circuit 150 has an output 152 connected to one terminal of the capacitor CP, and the other terminal of the capacitor CP is connected to the second power domain supply node 142. When the PUMP signal is initially low during startup of the power circuit 101 in a given pulse of the sensor pulse signal WSP, WSM, the voltage at the buffer output 152 is low. This causes the capacitor CP to charge up to the voltage of the second supply voltage signal VNVL. At this time VNVL is at the level of VCORE. In one implementation, the control circuit 144 changes the PUMP signal to a high state after the first supply voltage signal VCORE rises to the level of VREF. In response, the buffer 150 transitions the voltage of the buffer output 152 to a higher voltage (e.g., at or near the final level envisioned for VNVL of the second power domain circuit 132). The charged pump capacitor CP thus raises or boosts the second supply voltage signal VNVL to provide a boosted second supply voltage signal VNVL at the second power domain supply node 142. In one example, the boosting by the transition of the voltage at the buffer output 152 occurs after the regulator output 122 is disconnected from the second power domain supply node 142 in the given pulse. This prevents the first supply voltage 122 and supply regulator 120 from draining charge away from the second power supply signal VNVL at the second supply node 142.

The level shift circuit 130 performs level shifting between the voltage levels of the VCORE and VNVL signals to provide a data transfer communications channel between the first and second power domain circuits 121 and 132. In operation during a given pulse of the sensor pulse signal WSP, WSM, the logic circuit 126 reads the counter value from the memory circuit 134 via the interfaces 128, 131 and the level shift circuit 130. In one example, the count logic circuit 126 includes one or more registers to temporarily store the counter value read from the memory circuit 134. The counter circuit IC 102 in this example also includes a pulse and polarity detection circuit 152 with inputs connected to the Wiegand sensor outputs 106p, 106m, and further inputs connected to receive GMR sensor signals GMRP and GMPM from the sensor outputs 115p and 115m of the GMR sensor 114. The IC 102 further includes a GMR sense and ground switch circuit 154 with signal connections to the GMR sensor signals GMRP and GMPM at the outputs 115p and 115m, as well as a ground switch connection to provide a signal GNDSW at the sensor line 115s. Another isolation and level shift circuit 156 provides a signal transfer between the count logic circuit 126 of the first power supply domain circuit 124 and the circuits 152 and 154 of the IC 102.

In response to receipt of each given pulse of the sensor pulse signal WSP, WSM, the logic circuit 126 selectively updates the counter value according to the given pulse. The updating can include incrementing or decrementing the counter value based on a variety of different sensed conditions. Any suitable logic circuitry can be used, which implements any suitable algorithm to determine whether the counter value needs to be incremented or decremented based on receipt of the current given pulse of the sensor pulse signal WSP, WSM. The algorithm can take into account, for example, relative timing between signals from the first sensor 104 and the second sensor 114. This approach can be used, for instance, where a rotating or moving structure includes offset magnets to separately actuate the first and second sensors 104, 114. In such example, the logic circuit 126 determines the direction of travel or rotation of the moving structure based on the relative timing of the signals from the sensors 104 and 114. The logic circuit 126 in other examples, takes into account prior history of incrementing and/or decrementing of the counter value in determining or assessing whether the counter value should be incremented or decremented. In certain implementations, the logic circuit 126 writes the updated counter value to the non-volatile memory circuit 134 via the interfaces 128, 131 and the level shifting circuit 130 during the pulse of the sensor pulse signal WSP, WSM. This operation advantageously allows the MCU or other connected processor 140 to resume operation after a loss of power event, and read the counter value from the nonvolatile memory circuit 134 to determine the position of a moving or moved structure. The power harvesting operation of the power circuit 101, moreover, advantageously keeps the counter value updated in the memory 134 using power obtained from without requiring the presence of external supply voltage.

Figure 2:
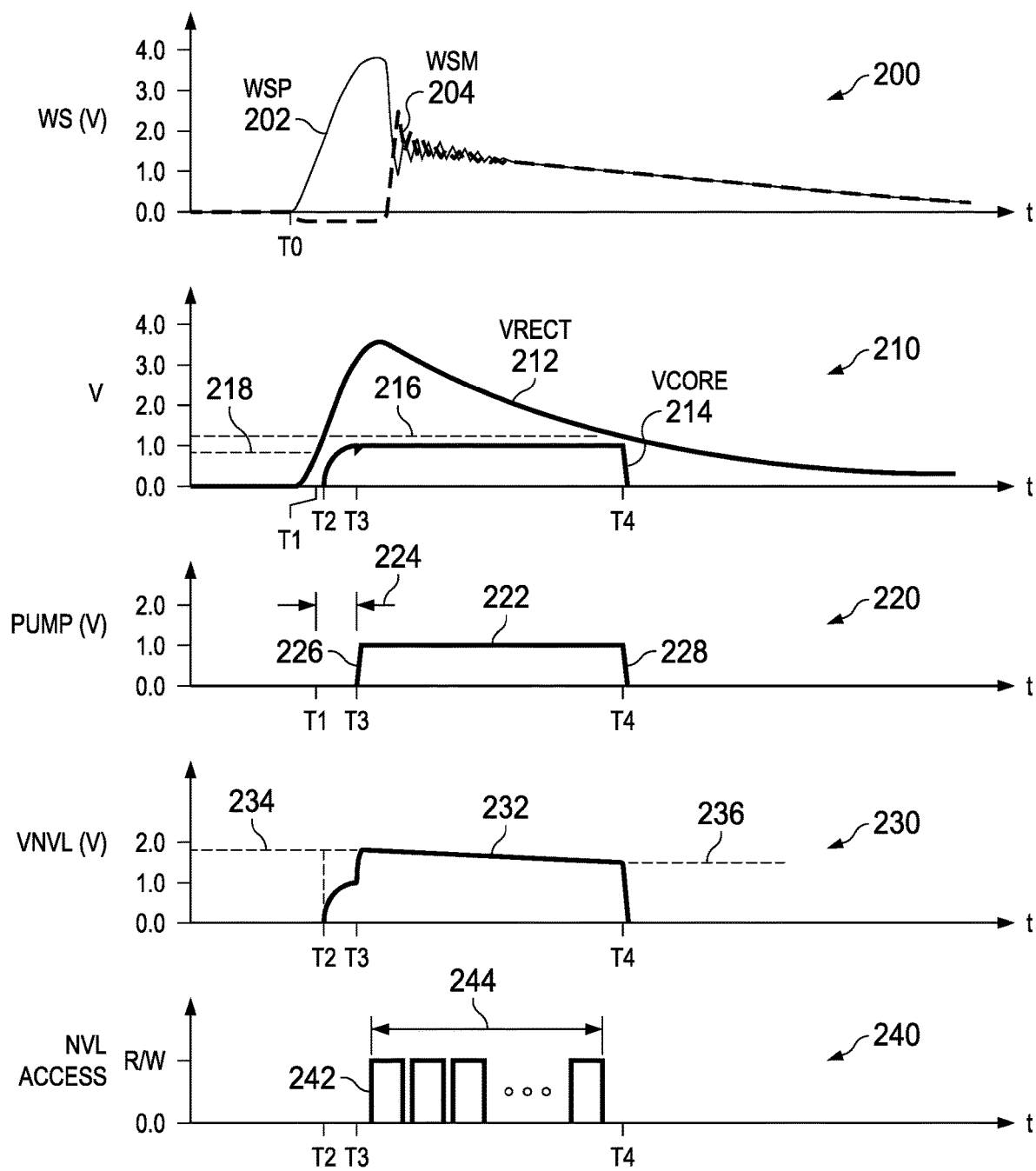
FIG. 2 is a signal diagram illustrating signals in the system of FIG. 1.

FIG. 2 shows a signal diagram with graphs 200, 210, 220, 230 and 240 illustrating various signals and waveforms in the example counter circuit IC 102 of FIG. 1. The graph 200 includes a curve 202 illustrating an example first Wiegand sensor signal WSP and a curve 204 illustrating a corresponding second Wiegand sensor signal WSM in an example given pulse of the differential sensor pulse signal WSP, WSM from the sensor 104. In this example, the sensor pulse signal begins at time T0 in FIG. 2. The graph 210 shows an example supply voltage signal curve 212 (VRECT) at the output of the rectifier circuit 108 corresponding to the sensor pulse signal WSP, WSM in the graph 200. The curve 212 begins to rise after T0 in response to the rise in the WSP signal curve 202. The graph 210 also includes a curve 214 illustrating the corresponding first supply voltage signal VCORE generated by the regulator circuit 120 at the first power domain supply node 122. At time T1 in FIG. 2, curve 212 exceeds a first threshold voltage 218 (e.g., 0.8 V). At time T2, the first supply voltage signal curve 214 begins to rise, eventually reaching the regulated set point value (e.g., 1.0 V) set by the reference voltage signal VREF from the power management circuit 116. The graph 220 in FIG. 2 illustrates a curve 222 showing an example control signal PUMP provided by the control circuit 144. In addition, the graph 230 includes a curve 232 showing an example of the second supply voltage signal VNVL, and the graph 240 includes a curve 242 showing memory accesses (reads and writes) of the nonvolatile memory circuit 134. The second supply voltage signal VNVL begins to rise at T2 to essentially follow the first supply voltage signal VCORE while the switch S1 is turned on (e.g., while the PUMP signal is low). During this time period, the second supply voltage signal VNVL will generally be slightly lower than the first supply voltage signal VCORE due to the on-state resistance (RDSON) of the PMOS transistor switch S1. While the first supply voltage signal VCORE and the connected second supply voltage signal VNVL are rising between T2 and T3 in FIG. 2, the first and second power domain capacitors CCORE and CNVL are charging, and the pump capacitor CP is charged to approximately the voltage of the second supply voltage signal VNVL.

As seen in the graph 220, the control circuit 144 in one example implements a state machine that generates a rising edge 226 of the PUMP signal 222 at time T3, which is a predetermined time 224 after T1. In this example, the control circuit 144 asserts the PUMP signal the predetermined time 224 after the example supply voltage signal curve 212 exceeds the threshold 218. In response to a sufficient rise in the control signal PUMP, the switching control signal SCS from the level shifting circuit 148 rises to a level sufficient to turn off the PMOS switch S1. This control signal assertion, moreover, raises the buffer output voltage at the node 152, and causes the charged pump capacitor CP to boost the second supply voltage signal VNVL, shown as a further rise in the curve 232 after T3. The amount of boost is determined by the initial charging voltage of the pump capacitor CP, as well as the capacitances of the capacitors CP and CNVL. The boosted second supply voltage signal VNVL thereafter reaches a boosted level 234 shown in the graph 230. In a given design, the boosted second supply voltage signal VNVL is provided at a level sufficient to ensure proper operation of the nonvolatile memory circuit 134 for a fixed, pre-determined number of accesses (e.g., 1.5 V).

At the same time, however, the regulator circuit 120 regulates the first supply voltage signal VCORE to a lower level. In this regard, the nonvolatile control circuit 124 and the counter logic circuit 126, as well as any other associated circuitry powered by the first supply voltage signal VCORE, do not require the boosted voltage level for proper operation. In this example, the boosted supply voltage signal VNVL is provided by the boost circuit 150, CP above a minimum operating voltage required by the memory circuit 134 by an amount such that the fixed number of accesses can be completed, while the circuits 124 and 126 are operated according to a lower regulated voltage signal VCORE. This operation advantageously reduces the energy consumption of the circuitry in the first power domain 121. In addition, the selective use of the boost circuitry 150, CP does not suffer from energy loss overhead associated with use of a separate regulator (e.g., LDO, not shown) to supply the memory circuit 134. In this regard, the use of the LDO regulator circuit 120 to provide the first supply voltage signal VCORE allows the operation of the circuits (e.g., 116) powered by the rectifier voltage VRECT at a voltage slightly higher than VNVL (e.g., 1.2 V) in the circuit of FIG. 1. This is because any LDO requires its input voltage be at least slightly higher than output voltage. In contrast, if a single supply were instead used, it would be limited by the VNVL level (1.5 V), and that in turn will limit VRECT at 1.7V.

Operating at 1.7 V would consume more energy than operating at 1.2 V. In another conventional solution, for a memory circuit 134 requiring a minimum of 1.5 V for proper operation, the use of two separate LDO regulator circuits to individually supply the first and second domain circuits 122, 132 would require the minimal voltage at the rectifier output node 110 to be approximately 1.7 V because the input of the LDO must be higher than its output by approximately 0.2-0.3 V. This will again consume more energy than our method where VRECT can go down to 1.2V. Thus, the illustrated examples advantageously allow lower voltage operation of the circuits supplied by the voltage signal VRECT (e.g., as low as approximately 1.2 V), and also facilitate regulated operation of the first domain circuitry 124, 126 at a suitable regulated voltage (e.g., 1.0 V), while providing the second domain supply voltage signal VNVL at a level to ensure proper operation of the memory circuit 134 (e.g., 1.5 V). The lower minimum VRECT also allows using the charge in the rectifier capacitor CRECT from its highest level as set by the Wiegand sensor down to 1.2 V, rather than 1.7 V in conventional solutions.

Continuing in FIG. 2, the sensor pulse signal WSP, WSM continues to increase, and thereafter decreases after T3 as shown in the graph 200. The rectifier voltage curve 212 accordingly reaches a peak after T3 in the illustrated example, and thereafter tapers off. Once the rectifier voltage curve 212 falls to a second threshold 216 (graph 210), the control circuit 144 removes the PUMP signal, resulting in a falling edge 228 of the signal curve 222 (graph 220) beginning at T4. The falling edge 228 of the PUMP signal allows the buffer output 152 to return to GND, and the regulator circuit 120 discontinues regulating the voltage at the first domain supply node 122.

During the time between T3 and T4, the first and second power domain circuits 121 and 132 are operating at the proper voltages to allow the logic circuit 126 and the memory 134 to maintain the appropriate counter value to indicate the position of the moving structure associated with the system 100. In particular, the graph 240 illustrates one or more memory access events in the curve 242 during a time period 244 between T3 and T4. As shown in the graph 230, the boosted second supply voltage signal VNVL may transition between T3 and T4 from the initial boosted level 234 to a lower boosted level 236 (e.g., from 1.8 V to 1.5 V), where both the levels 234 and 236 are above the minimum operating voltage of the memory circuit 134. During this time T3 to T4, The logic circuit 126 can initially read the previous counter value from the memory 134, selectively update the counter value (e.g., incrementing or decrementing), and write the updated counter value back to the non-volatile memory 134. The memory 134 then stores the updated counter value for subsequent use by the MCU 140. As discussed above, this operation is independent of any power loss conditions associated with the MCU 140 and other power domains of a given system implementation. Thus, the MCU 140 can restart after any power loss situation, and can read the counter value from the non-volatile memory 134 and take any appropriate action with the assurance that the stored counter value represents the current position of a particular moving or movable structure of interest (e.g., elevator, machine tool, flowmeter rotating structure).

The illustrated power circuit 101 advantageously uses energy of the sensor pulse signal WSP, WSM to operate the logic circuit 126 and the memory circuit 134 and other circuitry of the IC 102. Furthermore, the power circuit 102 facilitates use of small sensors 104, where the energy budget provided by the amplitude and duration of the sensor pulse signal WSP, WSM is limited. In particular, the regulator circuit 120 advantageously regulates the first supply voltage VCORE to a value less than a minimum required operating voltage of the non-volatile memory circuit 134, but still sufficient to power the first domain circuits 124, 126. The boost circuit 150, CP boosts or raises the second supply voltage signal VNVL to a level sufficient to provide proper operating power for the memory circuit 134 during a relevant portion of a given pulse of the sensor pulse signal WSP, WSM. Once the first and second domain circuits 121 and 132 have been effectively separated or isolated by opening the switch S1, the regulator circuit 120 continues to regulate the first supply voltage VCORE according to the reference voltage VREF. In one example, the regulator circuit regulates the first supply voltage VCORE to a value less than the boosted second supply voltage signal VNVL. In certain examples, moreover, the regulator circuit 120 regulates VCORE to a value less than a minimum required operating voltage of the non-volatile memory circuit 134. The LDO 120 in one example operates with an input voltage approximately 200 mV higher than its output voltage. The disclosed examples advantageously harvest more usable energy due than previous approaches because the lower operating voltage VCORE supplied to the circuits 124 and 126 results in a lower voltage VRECT at the supply output 110, allowing the circuits 108, 112 and 116 to consume lower energy and use the energy contained in CRECT down to a lower voltage. This advantageously facilitates intelligent consumption of the signal energy budget to implement the count logic circuit operation to read the counter value from the memory 134, selectively update the counter value, and write the updated counter value back to the memory 134 during a given pulse of the sensor pulse signal WSP, WSM. The presently disclosed examples also facilitate use of smaller, low-cost Wiegand sensors 104 than was previously possible using other power harvesting techniques. Furthermore, the disclosed techniques and circuitry facilitate intelligent use of the energy budget of a given sensor pulse signal WSP, WSM, tailored to the operating voltage requirements of the memory circuit 134 and the logic circuitry 124, 126.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An integrated circuit, comprising:
 a supply circuit having a supply input and a supply output;
 a power circuit coupled to the supply circuit and comprising:
   a first power domain circuit;
   a second power domain circuit;
   a regulator circuit, having a regulator input coupled to the supply output and a regulator output coupled to the first power domain circuit;
   a switch coupled between the first power domain circuit and the second power domain circuit, the switch having a switch control input;
   a control circuit having a first control output coupled to the switch control input and having a second control output; and
   a boost circuit having a boost input and a boost output, the boost input coupled to the second control output, the boost output coupled to the second power domain circuit, and the boost circuit configured to generate a voltage for the second power domain circuit responsive to a pulse signal at the boost input.

2. The integrated circuit of claim 1, wherein:
 the second power domain circuit requires a higher voltage than the first power domain circuit.

3. The integrated circuit of claim 1, wherein:
 the boost circuit includes:
   a buffer circuit, including a buffer input connected to the second control output to receive a control signal from the second control output, and a buffer output; and
   a capacitor, including a first terminal connected to the second power domain circuit, and a second terminal connected to the buffer output; and
 the control circuit is configured to provide the control signal including a rising edge a predetermined time after a first supply voltage signal at the first power domain circuit rises above a threshold voltage to raise a voltage at the second terminal of the capacitor to provide a second supply voltage signal at the second power domain circuit.

4. The integrated circuit of claim 3, wherein:
 the boost circuit is coupled to the first power domain circuit;
 the first power domain circuit is coupled to the second power domain circuit; and
 the control circuit is configured to disconnect the first power domain circuit from the second power domain circuit prior to outputting the voltage to the second power domain circuit.

5. The integrated circuit of claim 1, wherein the regulator circuit is a low dropout regulator.

6. The integrated circuit of claim 1, wherein the first power domain circuit and the second power domain circuit are formed in a single integrated circuit.

7. A circuit, comprising:
 a first circuit;
 a second circuit;
 a supply circuit having a supply input and a supply output;
 a regulator circuit, having a regulator input coupled to the supply output and a regulator output coupled to the first circuit;
 a switch coupled between the first circuit and the second circuit, the switch having a switch control input;
 a control circuit having a first control output coupled to the switch control input and having a second control output; and
 a boost circuit having a boost input and a boost output, the boost input coupled to the second control output, the boost output coupled to the second circuit, and the boost circuit configured to generate a voltage for the second circuit responsive to a pulse signal at the boost input.

8. The circuit of claim 7, wherein:
 the second circuit requires a higher voltage than the first circuit.

9. The circuit of claim 7, wherein:
 the boost circuit includes:
   a buffer circuit, including a buffer input connected to the second control output to receive a control signal from the second control output, and a buffer output; and
   a capacitor, including a first terminal connected to the second circuit, and a second terminal connected to the buffer output; and the control circuit is configured to provide the control signal including a rising edge a predetermined time after a first supply voltage signal at the first circuit rises above a threshold voltage to raise a voltage at the second terminal of the capacitor to provide a second supply voltage signal at the second circuit.

10. The circuit of claim 7, wherein:
the boost circuit is coupled to the first circuit;
the first circuit is coupled to the second circuit; and
the control circuit is configured to disconnect the first circuit from the second circuit prior to outputting the voltage to the second circuit.

11. The circuit of claim 7, wherein the regulator circuit is a low dropout regulator.

12. The circuit of claim 7, wherein the first circuit and the second circuit are formed in a single integrated circuit.

13. A system, comprising:
a first circuit;
a second circuit;
a supply circuit having a supply input and a supply output;
a regulator circuit, having a regulator input coupled to the supply output and a regulator output coupled to the first circuit;
a switch coupled between the first circuit and the second circuit, the switch having a switch control input;
a control circuit having a first control output coupled to the switch control input and having a second control output; and
a boost circuit having a boost input and a boost output, the boost input coupled to the second control output, the boost output coupled to the second circuit, and the boost circuit configured to generate a voltage for the second circuit responsive to a pulse signal at the boost input.

14. The system of claim 13, wherein:
the second circuit requires a higher voltage than the first circuit.

15. The system of claim 13, wherein:
the boost circuit includes:
a buffer circuit, including a buffer input connected to the second control output to receive a control signal from the second control output, and a buffer output; and
a capacitor, including a first terminal connected to the second circuit, and a second terminal connected to the buffer output; and
the control circuit is configured to provide the control signal including a rising edge a predetermined time after a first supply voltage signal at the first circuit rises above a threshold voltage to raise a voltage at the second terminal of the capacitor to provide a second supply voltage signal at the second circuit.

16. The system of claim 13, wherein:
the boost circuit is coupled to the first circuit;
the first circuit is coupled to the second circuit; and
the control circuit is configured to disconnect the first circuit from the second circuit prior to outputting the voltage to the second circuit.

17. The system of claim 13, wherein the regulator circuit is a low dropout regulator.

18. The system of claim 13, wherein the first circuit and the second circuit are formed in a single integrated circuit.

* * * * *